(12) United States Patent
Hori

(10) Patent No.: US 7,443,487 B2
(45) Date of Patent: Oct. 28, 2008

(54) EXPOSURE APPARATUS

(75) Inventor: Hisamitsu Hori, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/826,930

(22) Filed: Jul. 19, 2007

(65) Prior Publication Data

US 2008/0117396 A1    May 22, 2008

(30) Foreign Application Priority Data

Jul. 20, 2006   (JP)   ............................. 2006-198368

(51) Int. Cl.
 G03B 27/04   (2006.01)
 G03B 27/42   (2006.01)
(52) U.S. Cl. .......................................... 355/86; 355/53
(58) Field of Classification Search .................... 355/30, 355/53, 67, 78–79, 86
 See application file for complete search history.

(56) References Cited

U.S. PATENT DOCUMENTS

| 4,264,714 A |   | 4/1981  | Trausch |
| 4,346,164 A | * | 8/1982  | Tabarelli et al. ............. 430/311 |
| 4,480,910 A |   | 11/1984 | Takanashi et al. |
| 6,819,401 B2 | * | 11/2004 | Tsujikawa et al. ............ 355/66 |

FOREIGN PATENT DOCUMENTS

| JP | 55-7799 A     | 1/1980 |
| JP | 57-153433 A   | 9/1982 |
| JP | 2005-173129 A | 6/2005 |

* cited by examiner

Primary Examiner—Hung Henry Nguyen
(74) Attorney, Agent, or Firm—Birch, Stewart, Kolasch & Birch, LLP

(57) ABSTRACT

The exposure apparatus includes: a light source which emits parallel light having a wavelength used for exposure; a photomask which includes a substrate, an optical shielding layer and an optical selective layer, the substrate being capable of transmitting the light of the wavelength, the optical shielding layer being made of a material not transmitting the light of the wavelength, the optical selective layer selectively transmitting light in accordance with a shape to be formed by the exposure, the optical shielding layer and the optical selective layer being arranged on a first side of the substrate; a photomask stage which holds the photomask of which the first side has been coated with photosensitive material, in such a manner that the light emitted from the light source falls on a second side of the photomask reverse to the first side and is projected to the photosensitive material on the first side; a photomask rotation device which rotates the photomask stage on an axis perpendicular to the second side of the photomask; and a photomask tilt device which is capable of tilting the photomask held on the photomask stage in such a manner that the light emitted from the light source falls perpendicularly and obliquely on the second side of the photomask.

10 Claims, 15 Drawing Sheets

EXPOSURE APPARATUS

BACKGROUND OF THE INVENTION

1. Field of the Invention

The present invention relates to an exposure apparatus used in photolithography, and more particularly, to an exposure apparatus capable of forming exposed parts inside a photoresist layer which parts have a flared shape gradually broadening along the direction perpendicular to the surface of the photoresist layer.

2. Description of the Related Art

Photolithography techniques are used to form very fine patterns in a variety of applications, principally in the field of large-scale integration circuits (LSI). More particularly, in recent years, with progress in nano-technology, the use of photolithography has expanded into fields beyond electrical circuits or semiconductor elements, such as processing of display screens, nozzle plates for inkjet heads, and the like.

Photolithography requires an exposure apparatus in order to expose the photoresist. At present, there are exposure apparatuses of a type which performs exposure by placing a photomask and a substrate coated with the photoresist in contact with each other, a type which performs exposure by placing the photomask and the substrate coated with the photoresist in proximity to each other (maintaining a small gap between them), and a type which projects a pattern formed in the photomask onto the substrate coated with the photoresist, through a projection optical system, at the same size, or a magnified or reduced size.

In the contact type exposure system, there are other exposure apparatuses as described in Japanese Patent Application Publication Nos. 55-7799 and 2005-173129, in which a photoresist is applied on a side of a photomask, and the pattern of the photomask is transferred to the photoresist by projecting light to the other side of the photomask, which is not coated with the photoresist. In particular, in the method described in Japanese Patent Application Publication No. 2005-173129, it is possible to expose the photoresist in a tilting state and to form an oblique exposure pattern in the photoresist layer, by obliquely projecting light to the photomask.

In the exposure apparatuses, there are limitations on the resolution since light is used, and hence the degree of miniaturization that can be achieved in the pattern formed in the exposure region is also restricted as a result of this limited resolution. In order to improve the resolution limits, as disclosed in Japanese Patent Application Publication No. 57-153433, there is a method known as immersion exposure, in which the substrate coated with the photoresist to be exposed is immersed in liquid, such as water, and is then exposed with light in the liquid. According to this method, it is possible to improve the resolution limitations during exposure, and very fine patterns that are difficult to achieve with a normal exposure method can be easily formed.

However, depending on the application for which photolithography is used, there may be cases where it is wished to change the shape of the exposure pattern formed in the photoresist, in the depth direction of the photoresist layer. For example, when forming nozzle shapes for an inkjet apparatus by photolithography, it is required that the flare angle of the exposure pattern is changed along the direction perpendicular to the surface of the photoresist layer. An exposure pattern having a shape of this kind cannot be formed readily by using any of the exposure methods described in the above-described related art.

SUMMARY OF THE INVENTION

The present invention has been contrived in view of these circumstances, an object thereof being to provide an exposure apparatus whereby an exposure pattern can be formed in photoresist, or the like, while changing the flare angle of the exposure pattern along the direction perpendicular to the surface of the photoresist.

In order to attain the aforementioned object, the present invention is directed to an exposure apparatus, comprising: a light source which emits parallel light having a wavelength used for exposure; a photomask which includes a substrate, an optical shielding layer and an optical selective layer, the substrate being capable of transmitting the light of the wavelength, the optical shielding layer being made of a material not transmitting the light of the wavelength, the optical selective layer selectively transmitting light in accordance with a shape to be formed by the exposure, the optical shielding layer and the optical selective layer being arranged on a first side of the substrate; a photomask stage which holds the photomask of which the first side has been coated with photosensitive material, in such a manner that the light emitted from the light source falls on a second side of the photomask reverse to the first side and is projected to the photosensitive material on the first side; a photomask rotation device which rotates the photomask stage on an axis perpendicular to the second side of the photomask; and a photomask tilt device which is capable of tilting the photomask held on the photomask stage in such a manner that the light emitted from the light source falls perpendicularly and obliquely on the second side of the photomask.

Preferably, the optical selective layer selectively transmits the light having a prescribed wavelength.

Preferably, the optical selective layer selectively transmits the light having a prescribed angle of incidence.

Preferably, the optical selective layer has transmittance for the light of the wavelength that transmittance changes in accordance with an angle of incidence of the light of the wavelength and is highest for the light of the wavelength incident perpendicularly on the second side of the photomask.

Preferably, when the photomask is tilted by the photomask tilt device to make the light emitted from the light source fall obliquely on the second side of the photomask, a tilt angle of the photomask is adjusted in such a manner that the light falls on the second side of the photomask with the angle of incidence at which the light is not transmitted through the optical selective layer due to interference of the light incident in the optical selective layer.

Preferably, the exposure apparatus further comprises: an immersion tank which holds liquid capable of transmitting the light of the wavelength emitted from the light source, wherein the photosensitive material on the first side of the photomask is exposed to the light in a state where the photomask is immersed in the liquid in the immersion tank.

Preferably, the exposure apparatus further comprises: a graded transmittance plate which is arranged on an interface of the liquid with air when the photosensitive material on the first side of the photomask is exposed to the light emitted from the light source in a state where the photomask is tilted to make the light fall obliquely on the second side of the photomask, the graded transmittance plate having graded transmittance for the light of the wavelength in such a manner that intensity of the light arriving at the second side of the photomask through the graded transmittance plate and the liquid is uniform over the second side of the photomask.

Preferably, the photosensitive material on the first side of the photomask is exposed to the light in a state where the photomask, the photomask stage and the liquid are enclosed by the immersion tank and the graded transmittance plate.

Preferably, the exposure apparatus further comprises: an optical axis rotation device which is capable of rotating the photomask and the photomask tilt device jointly on an axis parallel to an optical axis of the light falling on the photomask, while keeping positions of the photomask and the graded transmittance plate relative to each other.

Preferably, the exposure apparatus further comprises: a light-receiving sensor which is arranged on the photomask stage and capable of measuring intensity of the light projected from the light source.

According to the present invention, it is possible to readily perform exposure while changing the tilt angle of the exposed part along the direction perpendicular to the surface of the photoresist. In particular, when performing exposure to form a nozzle of an inkjet head, for example, of which the shape significantly affects the performance, it is possible to increase the freedom of choice of the shape and hence a nozzle shape having high ejection characteristics can be formed readily.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

An exposure apparatus according to a first embodiment of the present invention is described below, with a method of manufacturing a nozzle plate of an inkjet head by using the exposure apparatus.

Photomask

A method of manufacturing a photomask used in the exposure apparatus according to the first embodiment of the present invention is described with reference to FIGS. 1A to 1F.

Figure 1A:
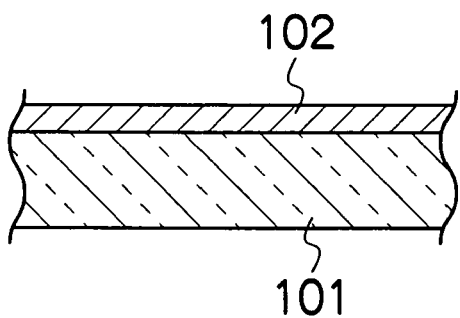
FIGS. 1A to 1F are illustrative diagrams for describing a method of manufacturing a photomask used in an exposure apparatus according to a first embodiment of the present invention.
Figure 2:
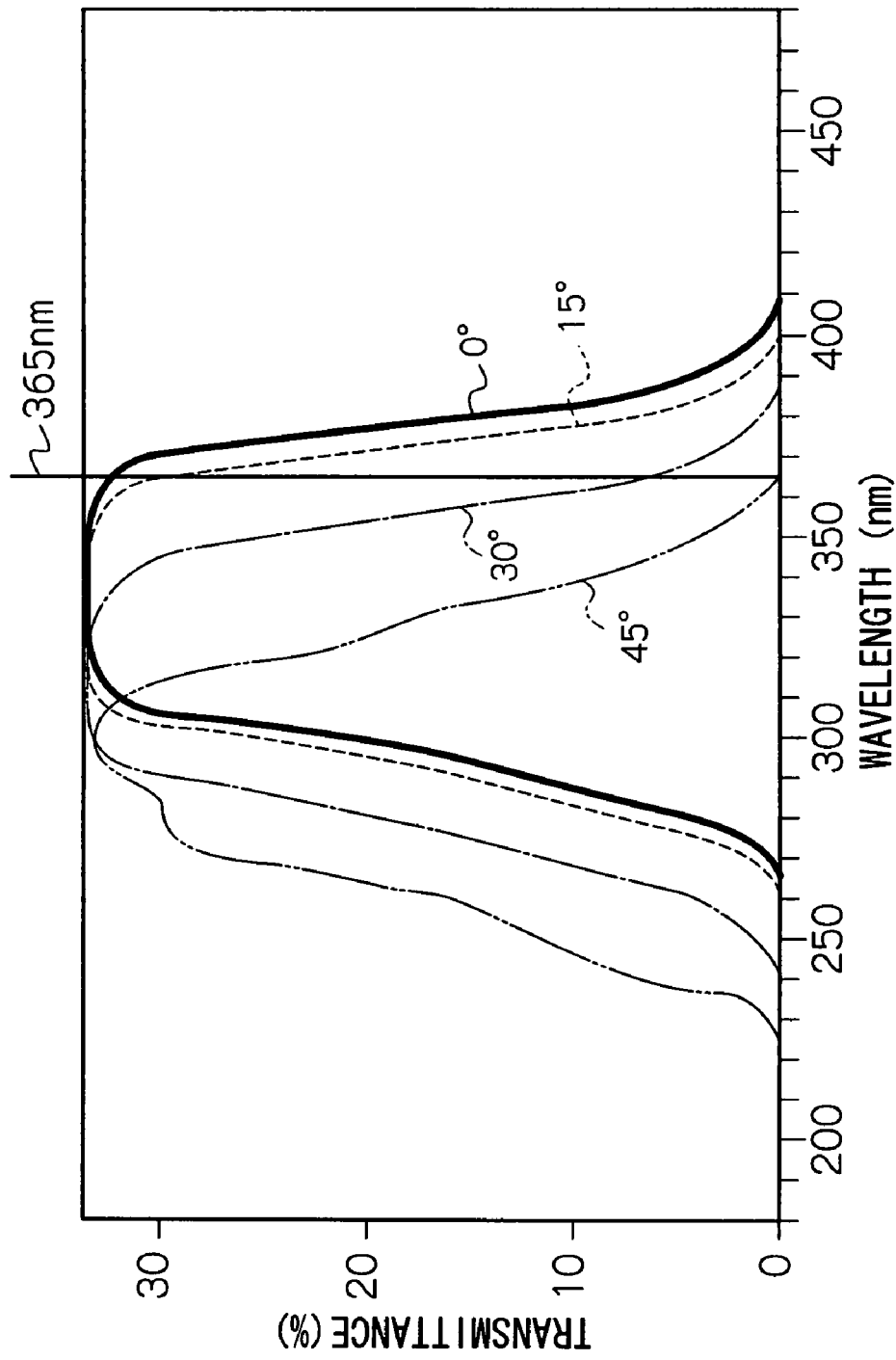
FIG. 2 is a graph showing the relationship between the angle of incidence of light on an optical interference layer, the wavelength of the incident light, and the transmittance of the optical interference layer for the incident light.

As shown in FIG. 1A, an optical interference film 102 is formed on a substrate 101 made of glass, or the like. The optical interference film 102 is a so-called optical multilayer film formed by alternately layering a material of high refractive index and a material of low refractive index. By adjusting the film thicknesses of the layered material of high refractive index and material of low refractive index, it is possible to make the optical interference film 102 have a desired transmittance for the incident light of a prescribed wavelength. For example, the materials of high refractive index include alumina ($Al_2O_3$) and titania ($TiO_2$), and the materials of low refractive index include silica ($SiO_2$) and magnesium fluoride ($MgF_2$). The optical interference film 102 is formed by alternately layering these materials by means of sputtering, vacuum deposition, or other such methods. In the present embodiment, as shown in FIG. 2, the materials and the thicknesses of the layers to constitute the optical interference film 102 are selected in such a manner that the optical interference film 102 has the following transmittances for the incident light having the wavelength of 365 nm: approximately 30 percent when the angle of incidence is 0°, and substantially zero percent when the angle of incidence is 35° or greater (by inference from FIG. 2).

Figure 1D:
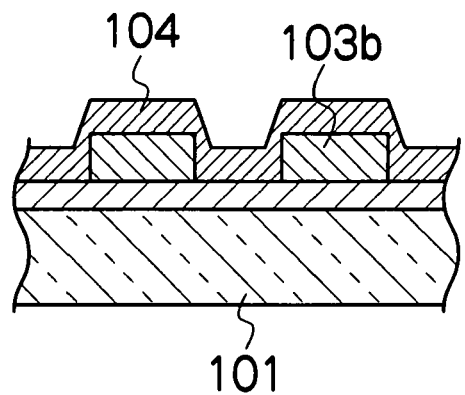
Figure 1B:
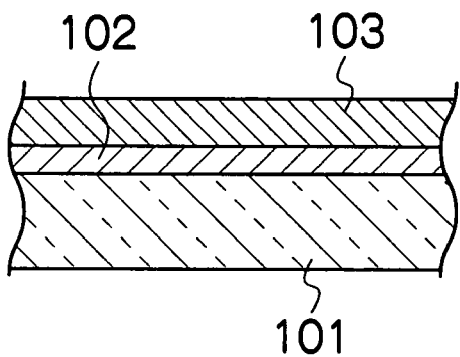

Next, as shown in FIG. 1B, the substrate 101 on which the optical interference film 102 has been formed is coated with a photoresist layer 103 by spin coating, or the like.

Figure 1E:
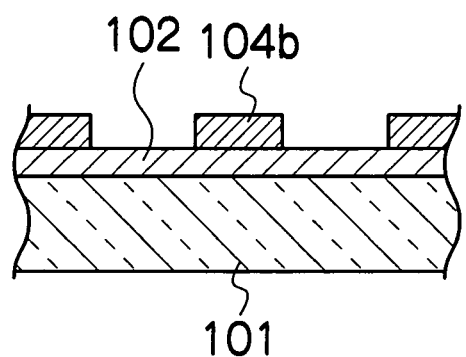
Figure 1C:
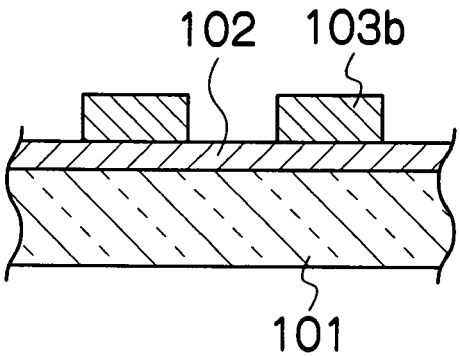

Thereupon, the substrate 101 has been coated with the photoresist layer 103 is pre-baked, and exposure and development are then carried out using a photomask (not shown), whereby a photoresist layer 103b is formed only in regions corresponding to open regions in an optical shielding film to be formed later, as shown in FIG. 1C.

Next, an optical shielding film 104 is formed over the whole of the surface of the substrate 101 on which the photoresist layer 103b has been formed, as shown in FIG. 1D. The optical shielding film 104 is made of chromium or chromium oxide, and is formed by means of sputtering or vacuum deposition.

After forming the optical shielding film 104, the whole of the substrate 101 is immersed in an organic solvent for a so-called "lift off" method, whereby the optical shielding film 104 on the regions where the photoresist layer 103b is formed is removed together with the photoresist layer 103b. By this means, the optical shielding film 104 remains to form an optical shielding layer 104b on the optical interference film 102 only in the regions where the photoresist layer 103b has not been formed, as shown in FIG. 1E.

Figure 1F:
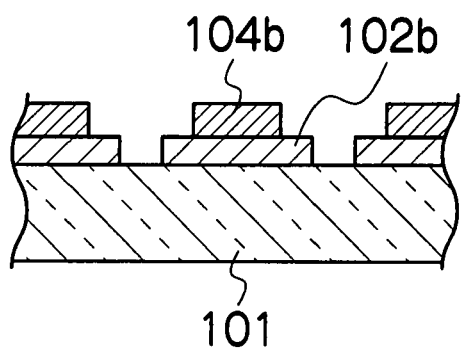

Subsequently, the optical interference film 102 is processed to remove portions forming open regions by means of laser trimming, or the like, and an optical interference layer 102b, which serves as an optical selective layer, is thereby formed as shown in FIG. 1F.

Thus, the photomask used in the present embodiment is manufactured.

Exposure Apparatus

Next, the exposure apparatus according to the present embodiment is described.

Figure 3:
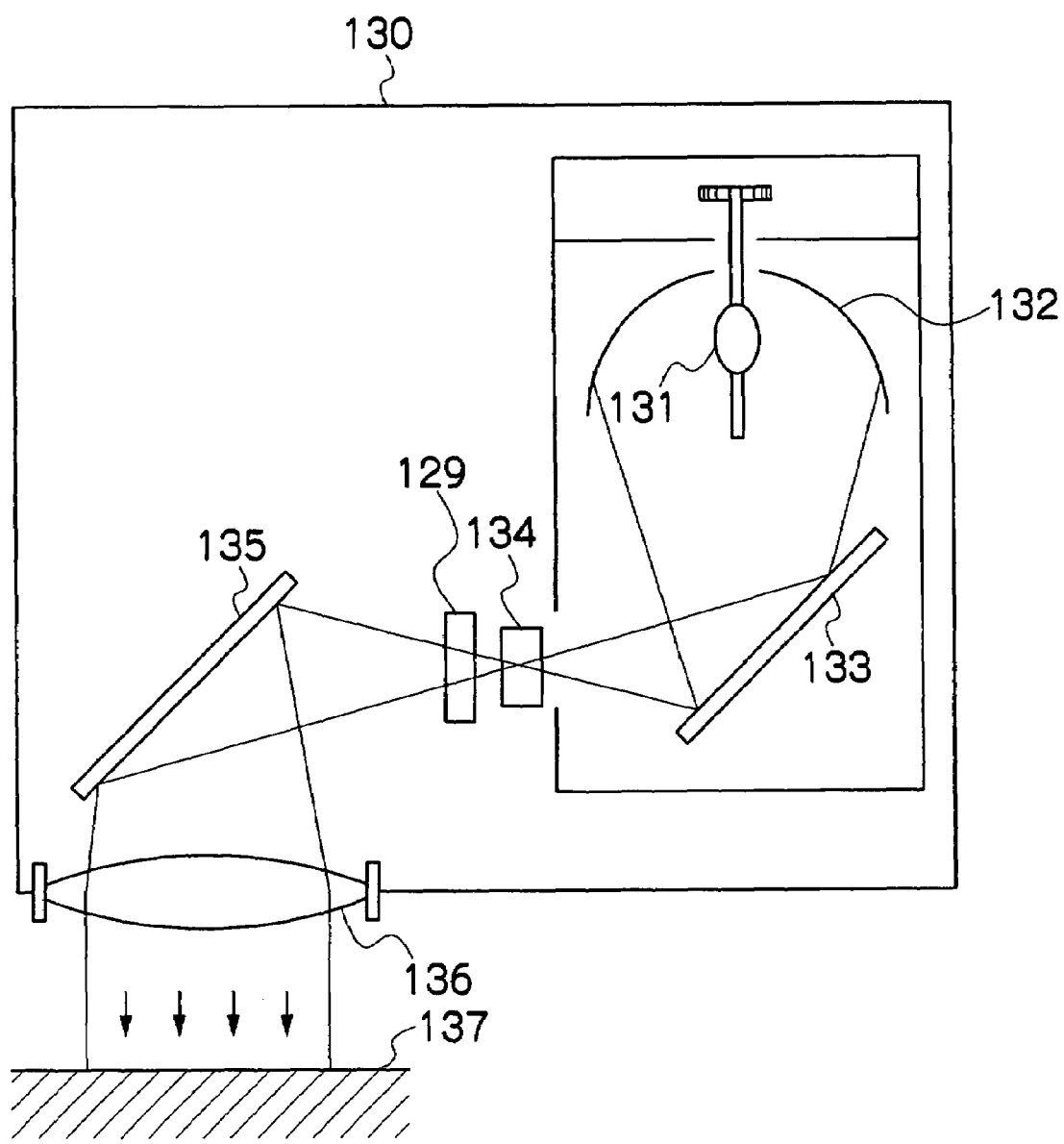
FIG. 3 is a schematic drawing of a light source optical system in the exposure apparatus.

Firstly, a light source optical system 130 of the exposure apparatus according to the present embodiment is described with reference to FIG. 3. In the light source optical system 130, an ultra-high pressure mercury lamp 131 is used as the light source, and the light path of the light emitted by the ultra-high pressure mercury lamp 131 is reflected by an elliptical condensing mirror 132, bent by a plane reflecting mirror 133 and then condensed by an integrator lens 134. The condensed light is passed through a filter 129 that blocks light of wavelengths shorter than 365 nm or that passes light having the wavelength of 365 nm, and the light path is bent by a plane reflecting mirror 135 and the light is then converted into parallel light by a collimator lens 136 and projected onto an irradiation surface 137.

Figure 4:
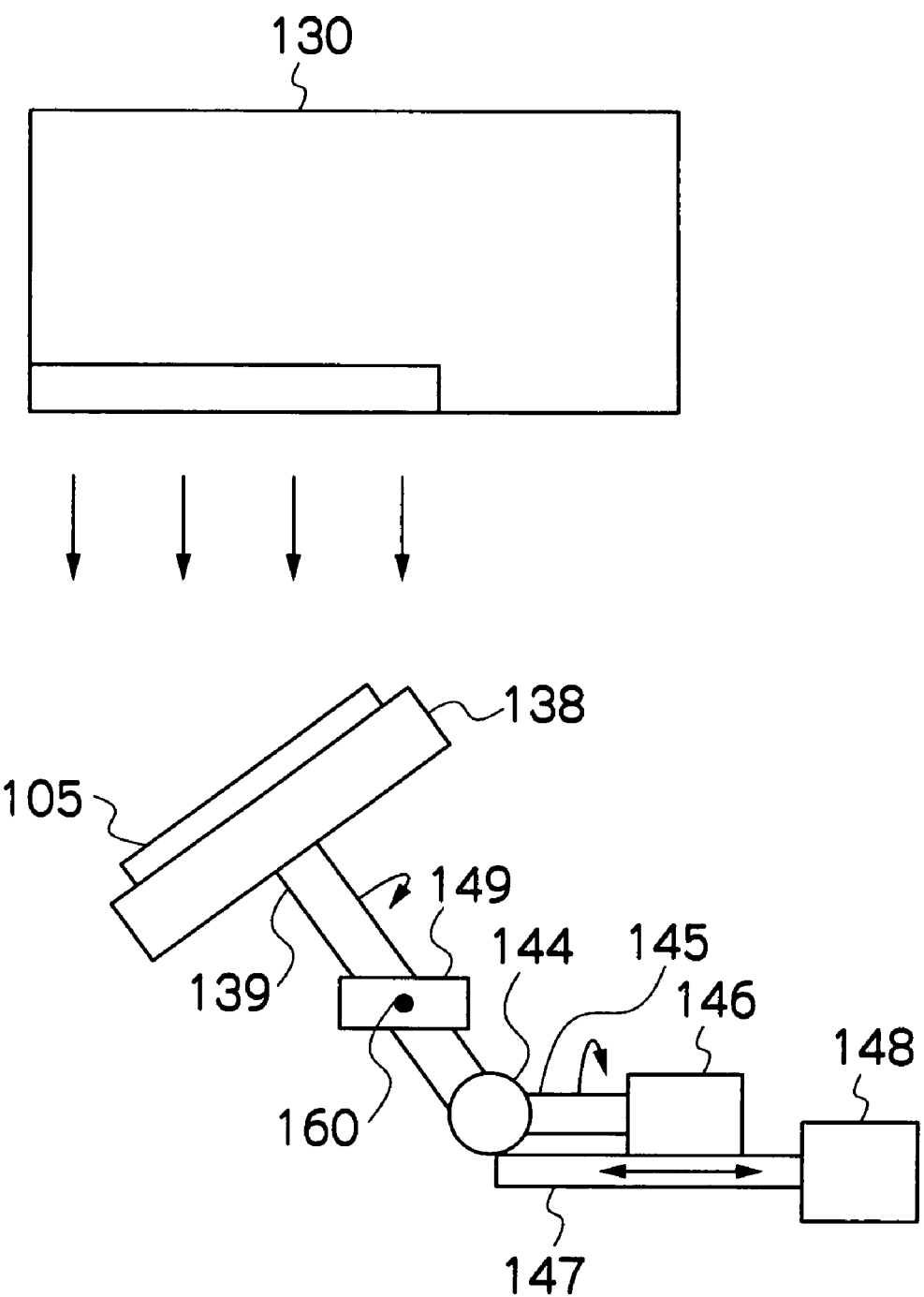
FIG. 4 is a schematic drawing of the mechanism of the exposure apparatus.

As shown in FIG. 4, the exposure apparatus according to the present embodiment includes the light source optical system 130. The photomask 105 is fixed in contact with a stage 138, which serves as a photomask stage, and the surface of the stage 138 reverse to the surface on which the photomask 105 is fixed is attached to a rotating shaft 139, which is perpendicular to the surface of the stage 138, in such a manner that the whole of the stage 138 rotates on the central axis of the rotating shaft 139. More specifically, a tilt rotation motor 146 is provided in order to rotate the rotating shaft 139, and a rotating shaft 145 caused to rotate by the tilt rotation motor 146 transmits a rotation to the rotating shaft 139 through a free joint 144. Furthermore, the stage 138 and the rotating shaft 139 are unitedly tiltable with respect to the projected light indicated with arrows in FIG. 4, whereby it is possible to change the angle of incidence of the projected light with respect to the photomask 105. More specifically, the tilt rotation motor 146 is disposed on a tilt slider 147, and is able to move over the tilt slider 147 by means of a tilt motor 148. By moving the tilt rotation motor 146 on the tilt slider 147, it is possible to move both the rotating shaft 145 and the free joint 144. A fixed point 160 on a spherical bearing 149 arranged on the rotating shaft 139 remains fixed in the same position when the tilt rotation motor 146 is moved on the tilt slider 147, and therefore, by moving the tilt rotation motor 146 by means of the tilt motor 148, it is possible to change the tilt angle of the stage 138 and the photomask 105 with respect to the projected light indicated with the arrows.

Consequently, in the state shown in FIG. 4, the stage 138 and the photomask 105 are disposed obliquely with respect to the projected light indicated with the arrows, and hence the projected light obliquely falls onto the photomask 105. Thus, it is possible to perform the tilt exposure by carrying out exposure in this state. In this state, the stage 138 is rotated according to requirements. Furthermore, by moving the tilt rotation motor 146 in the leftward direction in FIG. 4 by means of the tilt motor 148, the stage 138 is revolved about the fixed point 160 and thereby the angle of incidence of the projected light with respect to the photomask 105 can be changed. It is possible to carry out the perpendicular light exposure by performing exposure in a state where the stage 138 and the photomask 105 are perpendicular with respect to the projected light indicated with the arrows.

Figure 5:
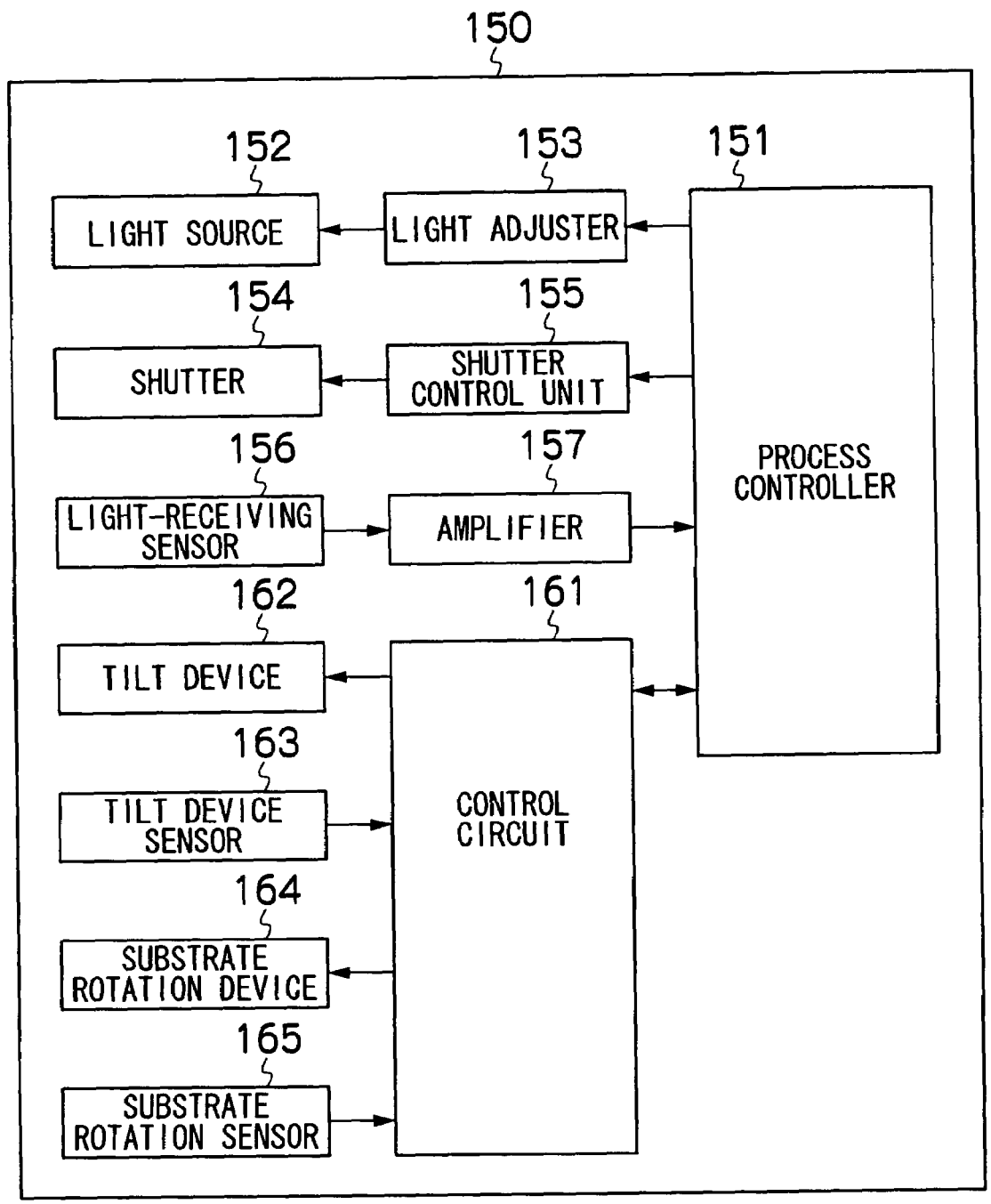
FIG. 5 is a block diagram showing the system configuration of the exposure apparatus.

Next, FIG. 5 shows a control system of the exposure apparatus according to the present embodiment.

The whole of the exposure apparatus 150 according to the present embodiment is controlled by a process controller 151. The process controller 151 is provided with a light adjuster 153 for controlling the amount of light emitted by the ultra-high pressure mercury lamp 131, which forms the light source 152. By controlling the light adjuster 153, it is possible to adjust the amount of light emitted by the light source 152. Moreover, in order to control the amount of light in the light source optical system 130, a shutter 154 (not shown in FIG. 3) is provided in the optical system, and the shutter 154 is controlled by a shutter control unit 155. The shutter control unit 155 controls the shutter 154 in accordance with instructions from the process controller 151.

A light-receiving sensor 156 is provided on the surface of the stage 138 onto which the projected light falls. In order to measure the intensity of the light passing through the photomask 105, or to measure the intensity of the light in the proximity of the photomask 105, the light-receiving sensor 156 is disposed on the surface of the stage 138 that makes contact with the photomask 105, or in the proximity of the photomask 105 on the stage 138, in such a manner that the light-receiving sensor 156 monitors the intensity of the incident light. The signal representing the intensity of the incident light issued by the light-receiving sensor 156 is amplified by an amplifier 157 and then transmitted to the process controller 151. In the process controller 151, in order to control the intensity of the light on the stage 138 on the basis of the signal issued by the light-receiving sensor 156 and amplified by the amplifier 157, a control signal is transmitted to the light adjuster 153 and the shutter control unit 155 in order to control the light source 152 and the shutter 154.

Moreover, the exposure apparatus 150 according to the present embodiment has a mechanism for rotating the stage 138, on which the photomask 105 is disposed, and also changing the tilt angle of the stage 138 with respect to the projected light. More specifically, the rotation of the stage 138 is performed by means of a substrate rotation device 164, which serves as a photomask rotation device, in accordance with instructions from a control circuit 161. The substrate rotation device 164 is constituted of the rotating shaft 139, the free joint 144, the rotating shaft 145, and the tilt rotation motor 146, and the substrate rotation device 164 serves as the device for rotating the stage 138. In the exposure apparatus 150 according to the present embodiment, a substrate rotation sensor 165 (not shown in FIG. 4) is provided as a sensor required to control the substrate rotation device 164, and it is possible to determine the rotational state of the stage 138 and the start point and the end point of the rotation. The substrate rotation device 164 is controlled by the control circuit 161 on the basis of the positional information, and the like, obtained through the substrate rotation sensor 165.

Furthermore, as the device for changing the tilt angle with respect to the projected light, a tilt device 162 is provided to form a photomask tilt device, whereby the tilt angle with respect to the projected light can be changed in accordance with instructions from the control circuit 161. The tilt device 162 is constituted of the tilt slider 147 and the tilt motor 148, and the tilt device 162 makes the stage 138 tilt about the fixed point 160 in the spherical bearing 149 provided in the rotating shaft 139, by moving the tilt rotation motor 146. In the exposure apparatus 150 according to the present embodiment, a tilt device sensor 163 (not shown in FIG. 4) is provided as a sensor required to control the tilt device 162, and it is possible to determine the tilt angle of the stage 138 with respect to the projected light. The tilt device 162 is controlled by the control circuit 161 on the basis of the information obtained through the tilt device sensor 163. The tilt device 162 and the substrate rotation device 164 described above are controlled by means of the control circuit 161, and this control is implemented by the process controller 151.

Method of Using Exposure Apparatus

Figure 6:
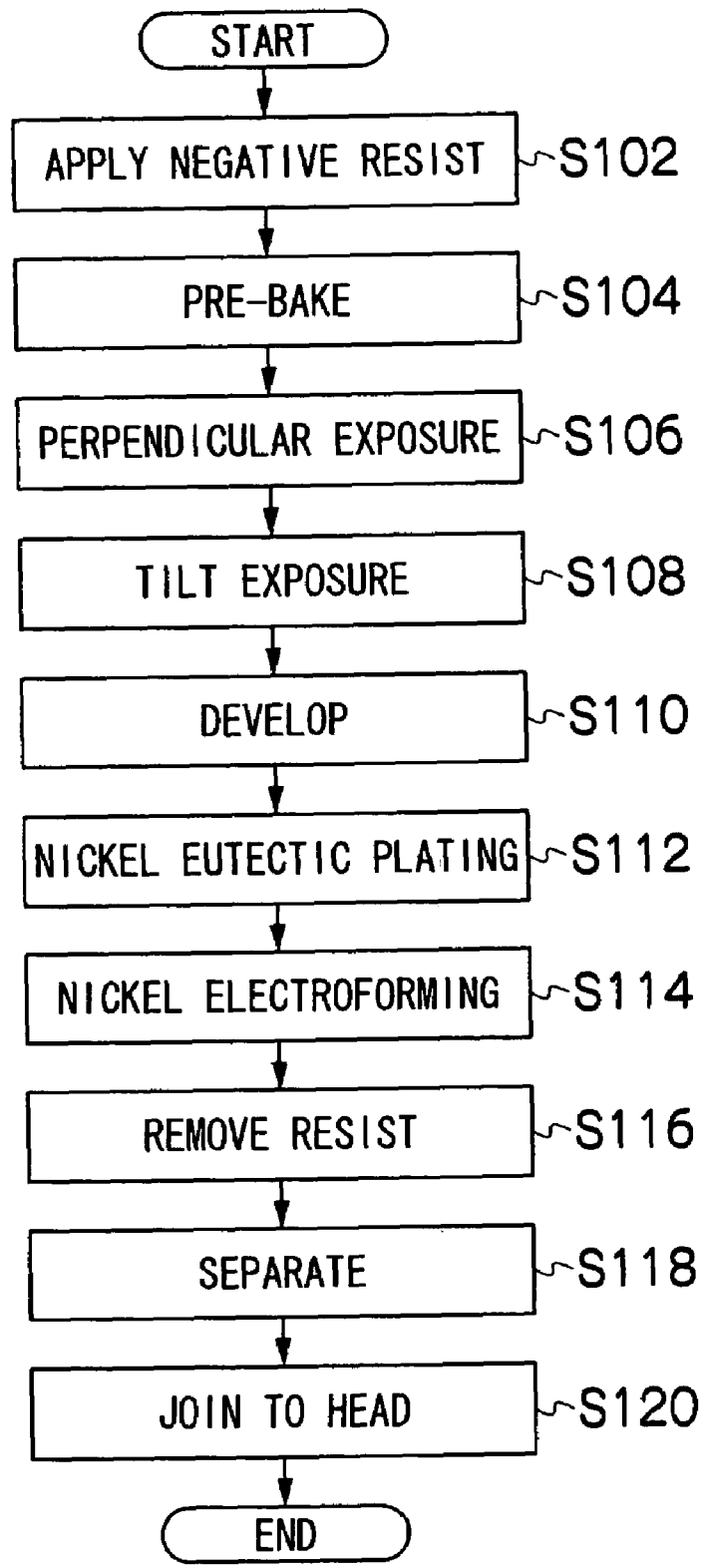
FIG. 6 is a flowchart of an embodiment of a manufacturing process using the exposure apparatus.

Next, a method of manufacturing a nozzle plate is described with reference to FIG. 6, as an embodiment of the method of using the exposure apparatus according to the present embodiment. FIG. 6 shows the sequence of manufacture of a nozzle plate using the exposure apparatus according to the present embodiment.

Figure 7A:
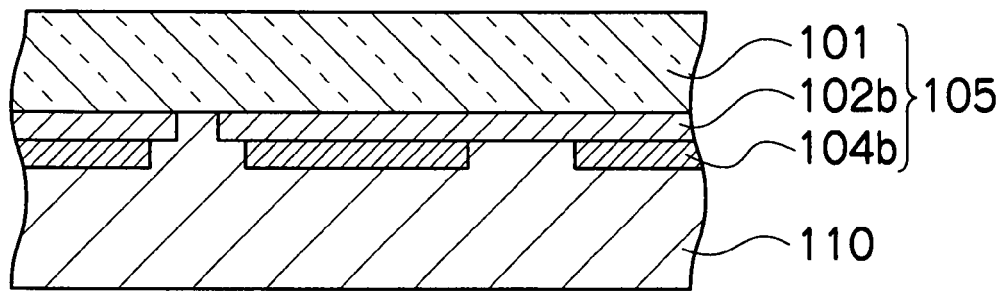
FIGS. 7A to 7C are processing step diagrams of the embodiment of the manufacturing process using the exposure apparatus.

Initially, a negative type of photoresist or a negative resist is applied onto a photomask at step S102. More specifically, as shown in FIG. 7A, the negative resist 110 is applied by spin coating, or the like, to the surface of the photomask 105 on which the optical interference layer 102b and the optical shielding layer 104b have been formed. The thickness of the applied film of the negative resist 110 corresponds to the thickness of the nozzle plate that is to be manufactured, and therefore in the present embodiment, a thick film resist is used. It is also possible that the negative resist 110 is bonded to the photomask 105 by means of a dry film (DRF) method, or alternatively, it is also possible that a substrate coated with the negative resist 110 is prepared and the photomask 105 is bonded to the surface of the negative resist 110 on the substrate.

Subsequently, the photomask 105 coated with the negative resist 110 is pre-baked at step S104.

Figure 7B:
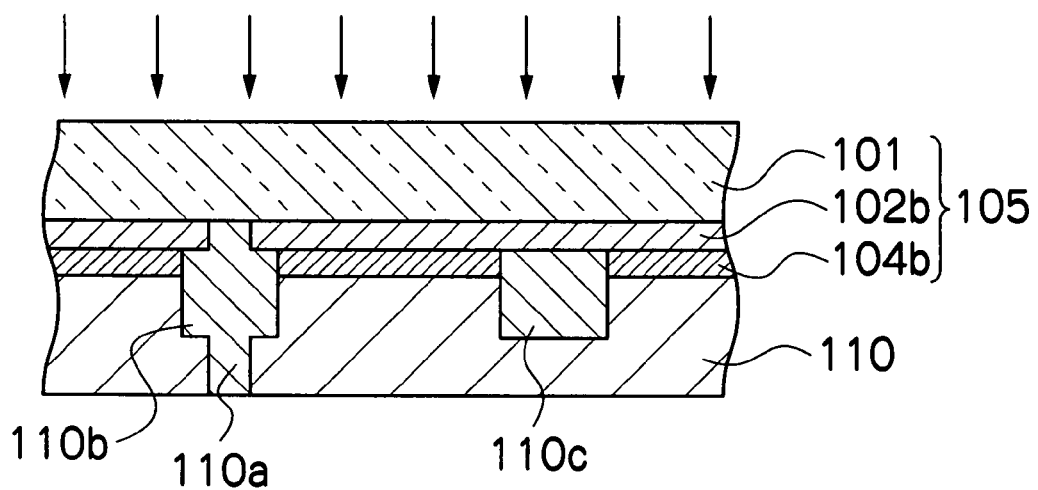

Thereupon, at step S106, the perpendicular exposure is carried out, in which the projected light perpendicularly falls onto the photomask 105. More specifically, as shown in FIG. 7B, the projected light indicated with the arrows perpendicularly falls onto the surface of the photomask 105 on which the optical interference layer 102b and the optical shielding layer 104b are not formed. By this means, in the open regions of the optical interference layer 102b, since none of the incident light is absorbed, then the light of the strongest intensity is projected into the negative resist 110. Therefore, as shown in FIG. 7B, in these regions, the incident light reaches down to the deepest level and penetrates through the negative resist 110, and a region 110a of the resist 110 is thereby exposed. In a part of the resist 110 that corresponds to the open region in the optical shielding layer 104b but where the optical interference layer 102b is formed, only 30 percent of the incident light is transmitted, due to the presence of the optical interference layer 102b. Therefore, the incident light does not pass through the negative resist 110, but rather, the negative resist 110 is exposed up to an intermediate region, and a region 110b of the resist shown in FIG. 7B is thereby exposed. The same applies to the other part of the resist that corresponds to the open region of the optical shielding layer 104b but where the optical interference layer 102b is formed, and a region 110c of the resist 110 shown in FIG. 7B is exposed. In a region that is covered with the optical shielding layer 104b of the photomask 105, the incident light does not pass through the optical shielding layer 104b, and therefore the negative resist 110 formed in this region is not exposed.

Figure 9:
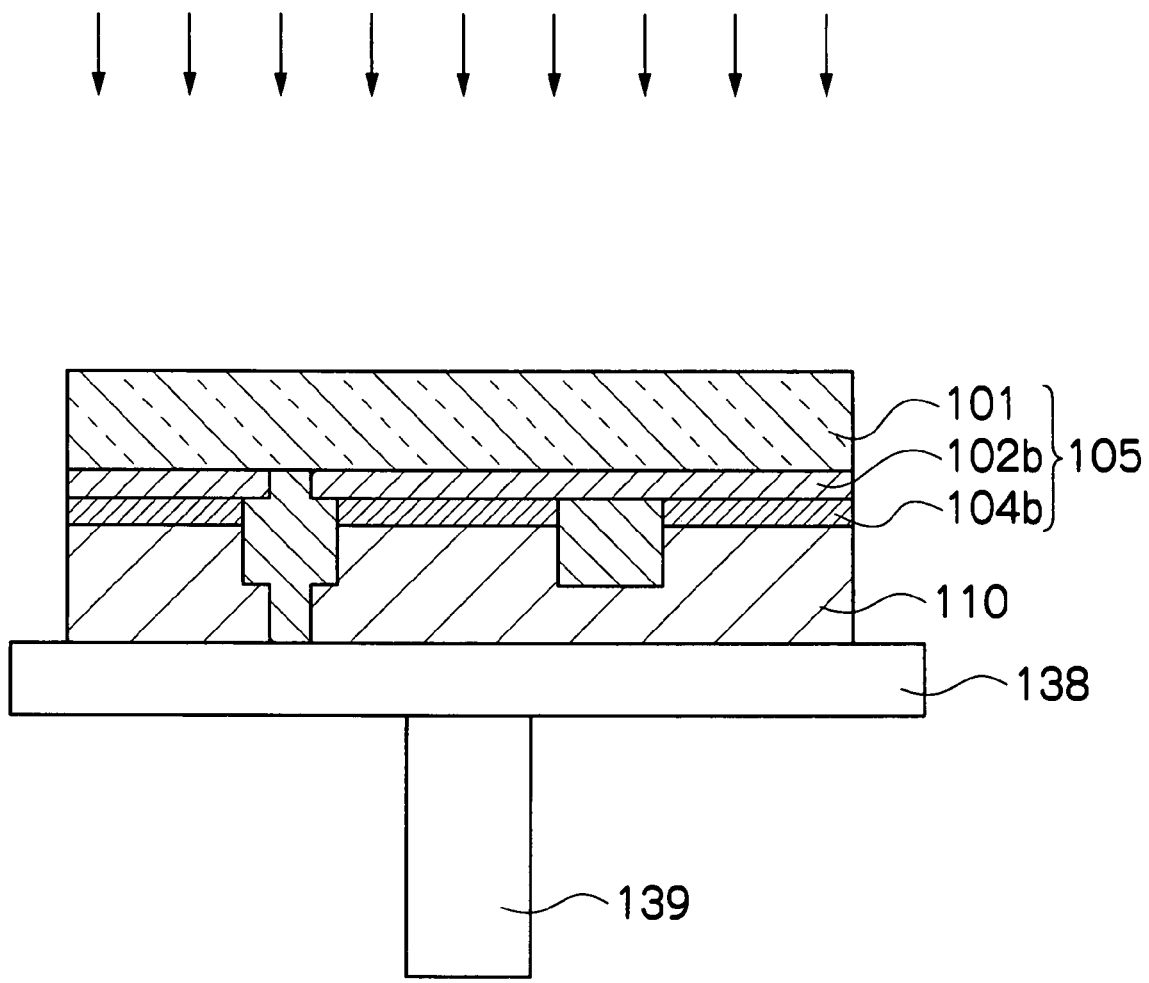
FIG. 9 is an approximate drawing of perpendicular exposure by means of the exposure apparatus.

FIG. 9 shows a state where the negative resist 110 applied on the photomask 105 is exposed with the light projected perpendicularly onto the photomask 105. Since the projected light perpendicularly falls onto the photomask 105 and the stage 138, then the negative resist 110 is exposed with the light in accordance with the pattern formed in the photomask 105.

Thereupon, the tilt exposure is carried out at step S108, in which the projected light obliquely falls onto the photomask 105. More specifically, as shown in FIG. 4, the stage 138 of the exposure apparatus according to the present embodiment is tilted with respect to the projected light by means of the tilt device, thereby enabling the projected light to obliquely fall onto the photomask 105. In the present embodiment, the tilt angle of the stage 138 is approximately 35° with respect to the projected light, and then the angle of incidence of the projected light with respect to the optical interference layer 102b in the photomask 105 is also 35°. As seen from FIG. 2, if the angle of incidence is 35°, then due to the interference of the incident light in the optical interference layer 102b, the amount of incident light transmitted through the optical interference layer 102b becomes substantially zero.

Figure 7C:
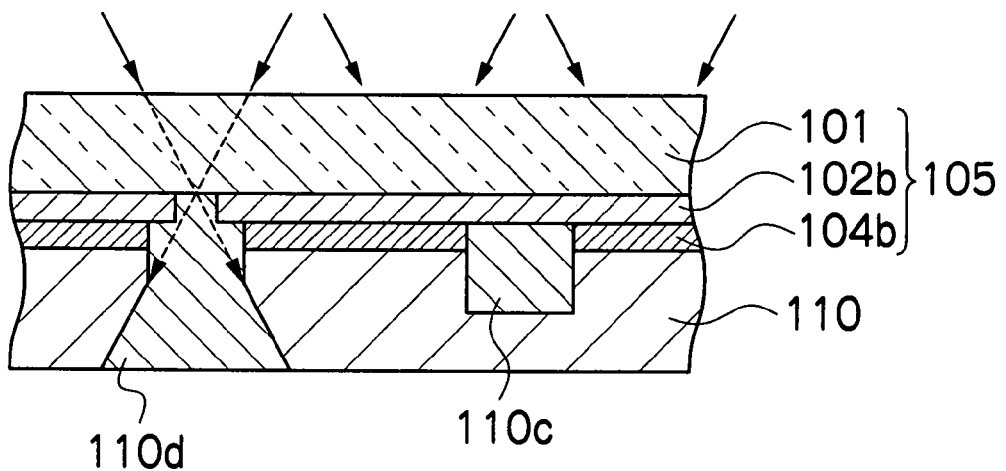

FIG. 7C shows more specifically the state where the projected light falls onto the photomask 105 while the photomask 105 is tilted and rotated. When the projected light obliquely falls onto the photomask 105 as indicated with the arrows, the incident light passing through the open region in the optical interference layer 102b penetrates through the negative resist 110, and a region 110d of a flared shape in the negative resist 110 is thereby exposed. On the other hand, in the region that is covered with the optical interference layer 102b, as described with reference to FIG. 2, the transmittance of the incident light is substantially zero percent since the angle of incidence is 35°, and therefore the negative resist 110 is not exposed with the incident light in this region. Consequently, in step S108, the negative resist 110 is only exposed with the incident light that enters through the open region of the optical interference layer 102b.

Figure 10:
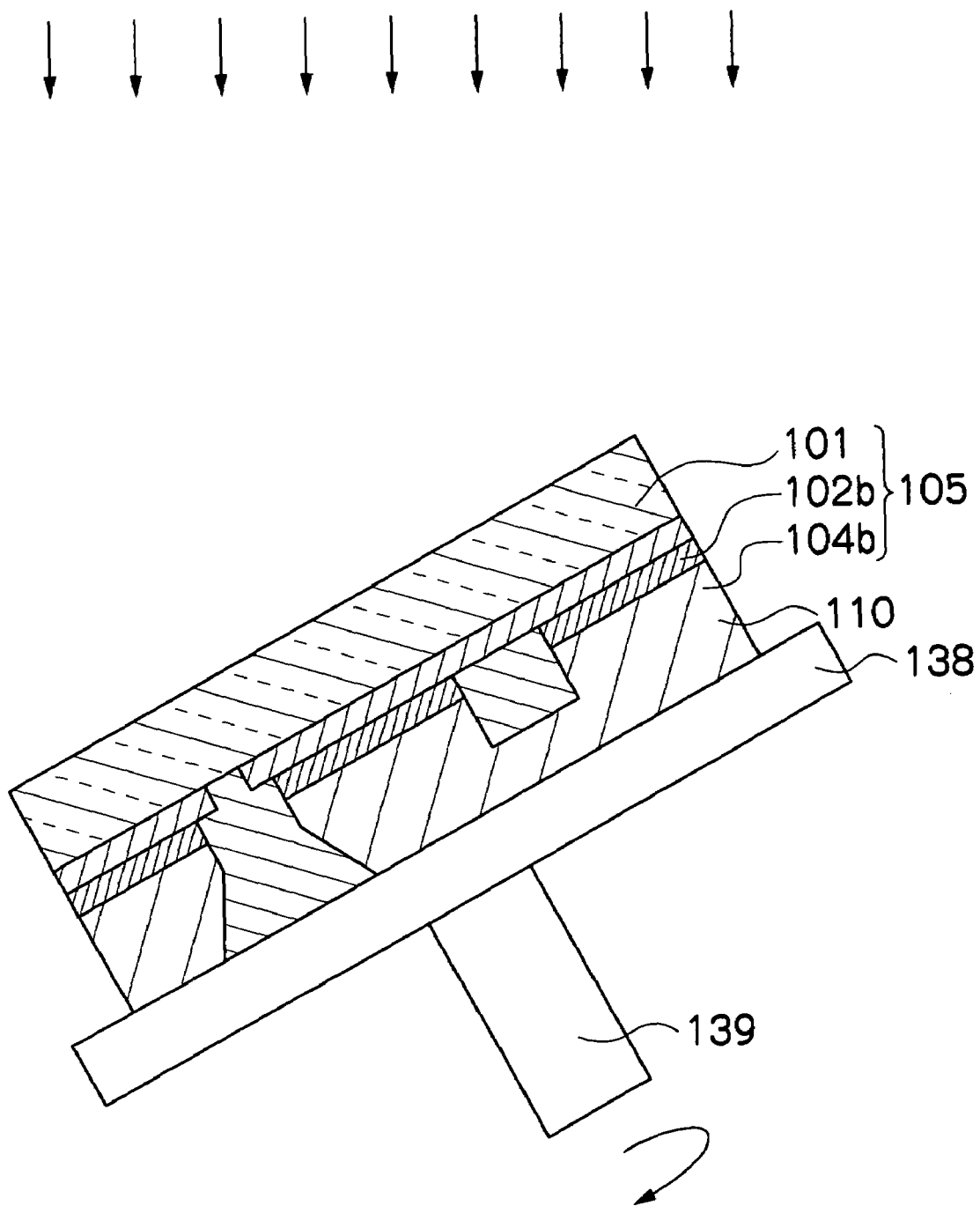
FIG. 10 is an approximate drawing of tilt exposure by means of the exposure apparatus.

FIG. 10 shows a state where the negative resist 110 applied on the photomask 105 is exposed with the light projected obliquely onto the photomask 105. By tilting the photomask 105 and the stage 138 with respect to the projected light, and rotating the photomask 105 and the stage 138 on the rotating shaft 139, it is possible to make the projected light obliquely fall onto the photomask 105, over the whole surface of the photomask 105.

Subsequently, the negative resist 110 on the photomask 105 is developed and then post-baked at step S110.

Figure 8A:
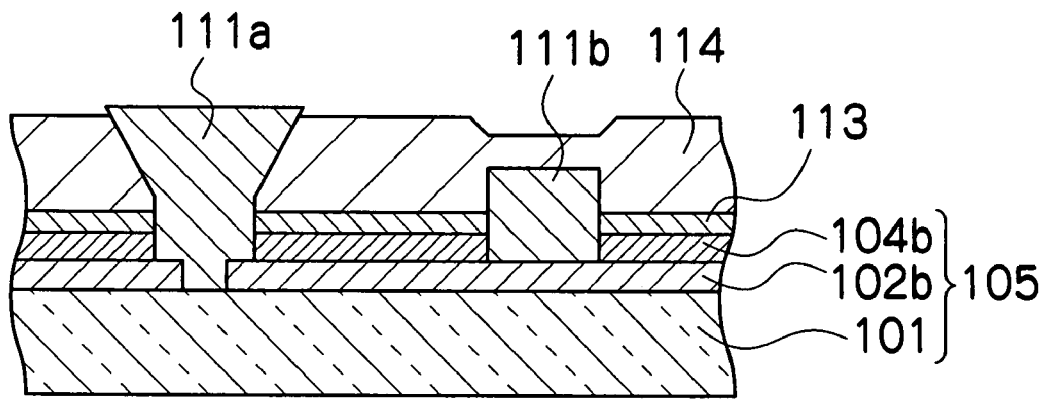
FIGS. 8A to 8C are processing step diagrams of the embodiment of the manufacturing process using the exposure apparatus.

Thereupon, eutectic plating of nickel is applied at step S112. More specifically, as shown in FIG. 8A, the eutectic nickel plating is applied on the photomask 105 on which the negative resist layers 111a and 111b have been formed from the exposed regions. The eutectic nickel plating is applied to a film thickness of 1 μm to 3 μm, using a plating solution containing polytetrafluoroethylene (PTFE). The eutectic nickel plating is effective only onto the metal parts, and therefore a eutectic-plating nickel layer 113 is formed only on the surface of the optical shielding layer 104b, as shown in FIG. 8A.

Then, electroforming of nickel is applied at step S114. More specifically, as shown in FIG. 8A, an electroformed nickel layer 114 is deposited by nickel electroforming onto the region where the eutectic-plating nickel layer has been formed, in other words, onto the eutectic-plating nickel layer 113, as shown in FIG. 8A. The thickness of the nickel deposited in this step is 10 μm to 50 μm.

Figure 8B:
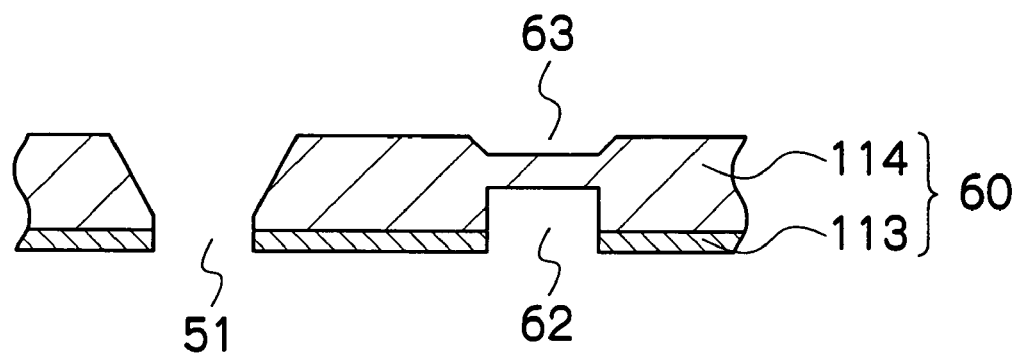

Then, the negative resist layers 111a and 111b are removed at step S116 by using an organic solvent, or the like, whereupon a nozzle plate 60 constituted of the eutectic-plating nickel layer 113 and the electroformed nickel layer 114 is separated from the photomask 105 at step S118. Thereby, as shown in FIG. 8B, the nozzle plate 60 formed with a nozzle 51, a hydrophilic trapping groove 62, and an adhesive escape groove 63 is completed.

Figure 8C:
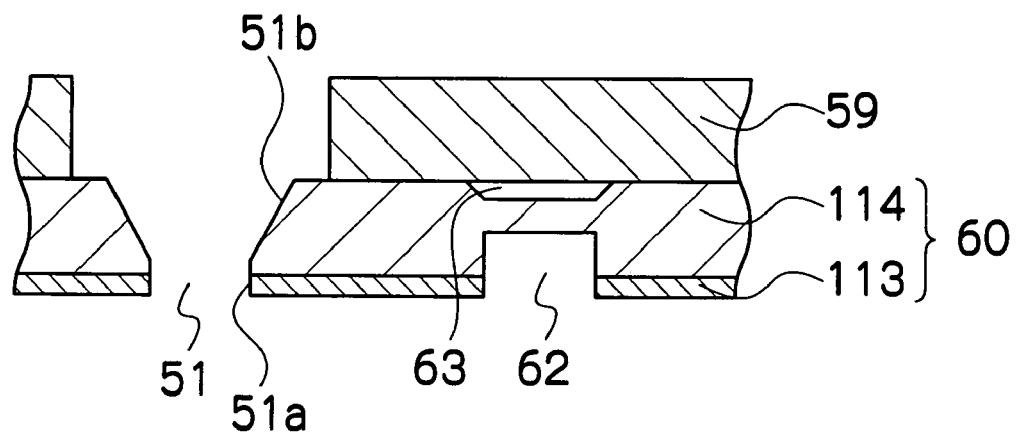

Thereupon, at step S120, the manufactured nozzle plate 60 is bonded with a connecting plate 59 of a liquid ejection head as shown in FIG. 8C, thereby forming the liquid ejection head. This bonding process is performed using adhesive, or the like, and since the adhesive that is surplus to the bonding process enters into the adhesive escape groove 63, then it is possible to achieve a clean bond with a good production yield rate. In the nozzle plate 60 thus manufactured, it is possible to achieve a composition for the nozzle 51 of two regions having different taper angles: a region 51a of which wall is perpendicular to the nozzle plate 60 and a region 51b that is tapered toward the region 51a, and therefore it is possible to improve the ink ejection characteristics.

Moreover, it is also possible that the stage 138 is slightly tilted, rather than perpendicular, with respect to the projected light in step S106 to perform the tilt exposure as in step S108, so that the nozzle 51 has a region of large taper angle and a region of small taper angle.

Second Embodiment

In the second embodiment, exposure is carried out by means of an immersion type of exposure apparatus (an immersion exposure apparatus).

Figure 11:
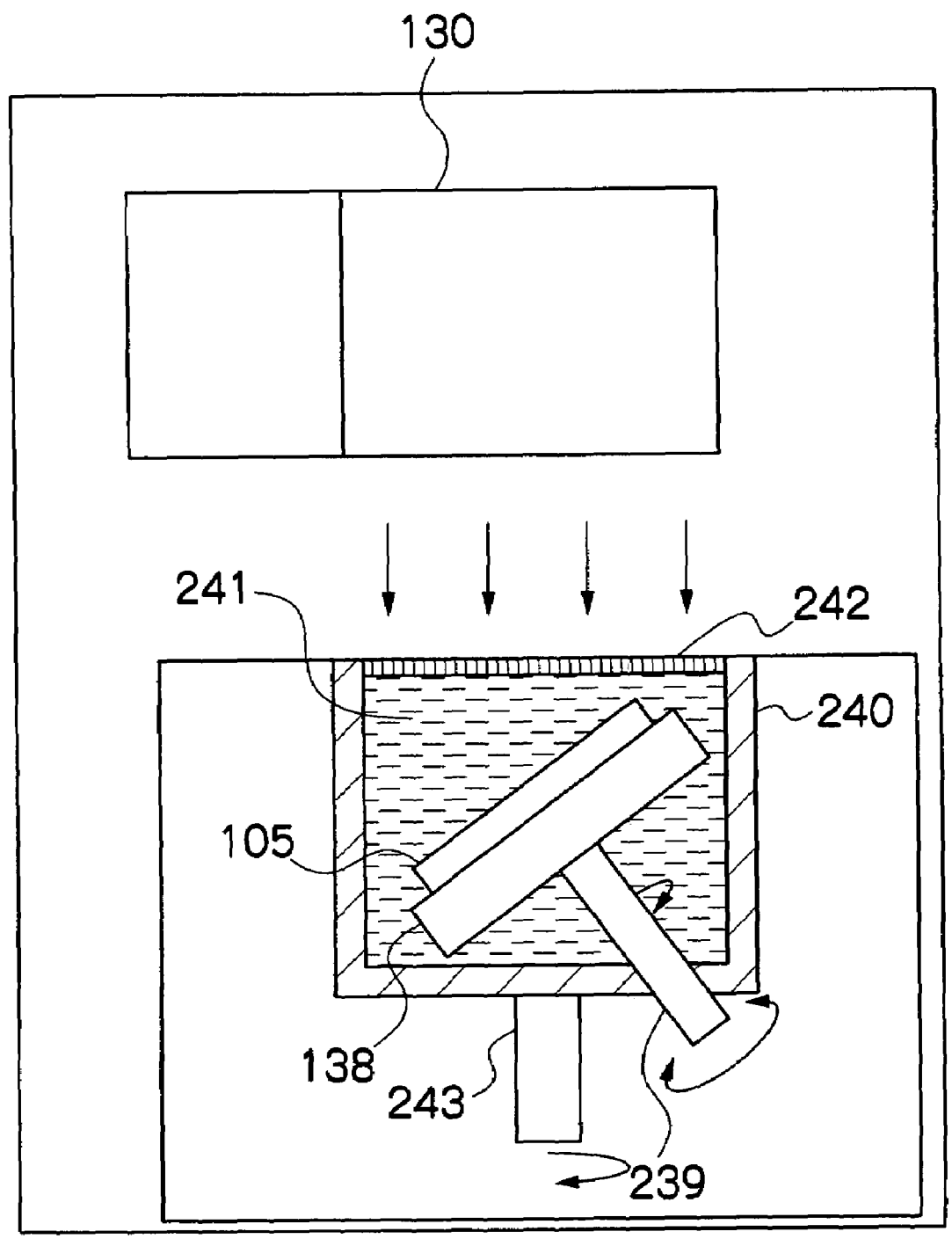
FIG. 11 is a schematic drawing of an exposure apparatus according to a second embodiment of the present invention.

FIG. 11 shows the immersion exposure apparatus according to the present embodiment, which is capable of performing tilt exposure. Similarly to the first embodiment, the exposure apparatus according to the present embodiment includes the light source optical system 130 shown in FIG. 3. The photomask 105 is fixed in contact with the stage 138. The surface of the stage 138 reverse to the surface on which the photomask 105 is fixed is attached to a rotating shaft 239, which is perpendicular to the surface of the stage 138, and the whole of the stage 138 rotates on the rotating shaft 239. Furthermore, the stage 138 and the rotating shaft 239 are unitedly tiltable with respect to the projected light, and by means of this tilt device, it is possible to project the light perpendicularly or obliquely onto the photomask 105. The photomask 105 is disposed inside an immersion tank 240 together with the stage 138, and pure water 241 serving as an immersion liquid is held in the immersion tank 240. A graded transmittance plate 242 is arranged on the surface of the pure water 241 serving as the immersion liquid, in other words, on the interface with the air, and the graded transmittance plate 242 is configured to make the projected light have uniform intensity distribution over the photomask 105. The rotating shaft 239 passes through the immersion tank 240 so that the rotating shaft 239 can be rotated independently. As described below, a composition is adopted whereby no liquid leaks out from the portion where the rotating shaft 239 passes through the immersion tank 240. Furthermore, the immersion tank 240 is composed in such a manner that the immersion tank 240 is rotatable on the optical axis of the projected light, by means of an optical axis rotation motor 243, thereby achieving a composition in which the uniformity of the light intensity distribution can be improved yet further.

When carrying out the tilt exposure in the immersion exposure apparatus according to the present embodiment, the stage 138 is tilted with respect to the projected light by means of the tilt device described below, and exposure is carried out in a state where the graded transmittance plate 242 is arranged in the optical path of the projected light, while rotating the whole of the immersion tank 240 and the graded transmittance plate 242 by means of the optical axis rotation motor 243. On the other hand, when carrying out the perpendicular exposure, the stage 138 is set to the perpendicular position with respect to the projected light by means of the tilt device described below, whereupon exposure is carried out in a state where the graded transmittance plate 242 is removed from the optical path of the projected light.

Generally, the refractive index of the surrounding environment of the photomask 105 during exposure is substantially 1 in the case of the normal exposure method where the surrounding environment is air, for example, whereas the refractive index of the surrounding environment of the photomask 105 during exposure is approximately 1.44 in the case of using the immersion exposure apparatus where the surrounding environment is pure water, for example. The substrate of the photomask 105 is generally made of quartz glass, or the like, and the refractive index of quartz glass is approximately 1.47, then in the immersion exposure apparatus, it is possible to make the refractive index of the substrate of the photomask 105 close to the refractive index of the surrounding environment. Hence, in the normal exposure apparatus, since the periphery of the photomask 105 lies in contact with air, then due to total reflection, the angle of incidence of the light projected into the photoresist layer on the photomask 105 has an upper limit of approximately 38°, whereas in the immersion type of exposure apparatus, it is possible to make the angle of incidence larger than this. Consequently, a method that carries out the tilt exposure by means of the immersion exposure apparatus is suitable for forming the region of large taper angle since it allows exposure of the region of large flare angle.

Figure 12:
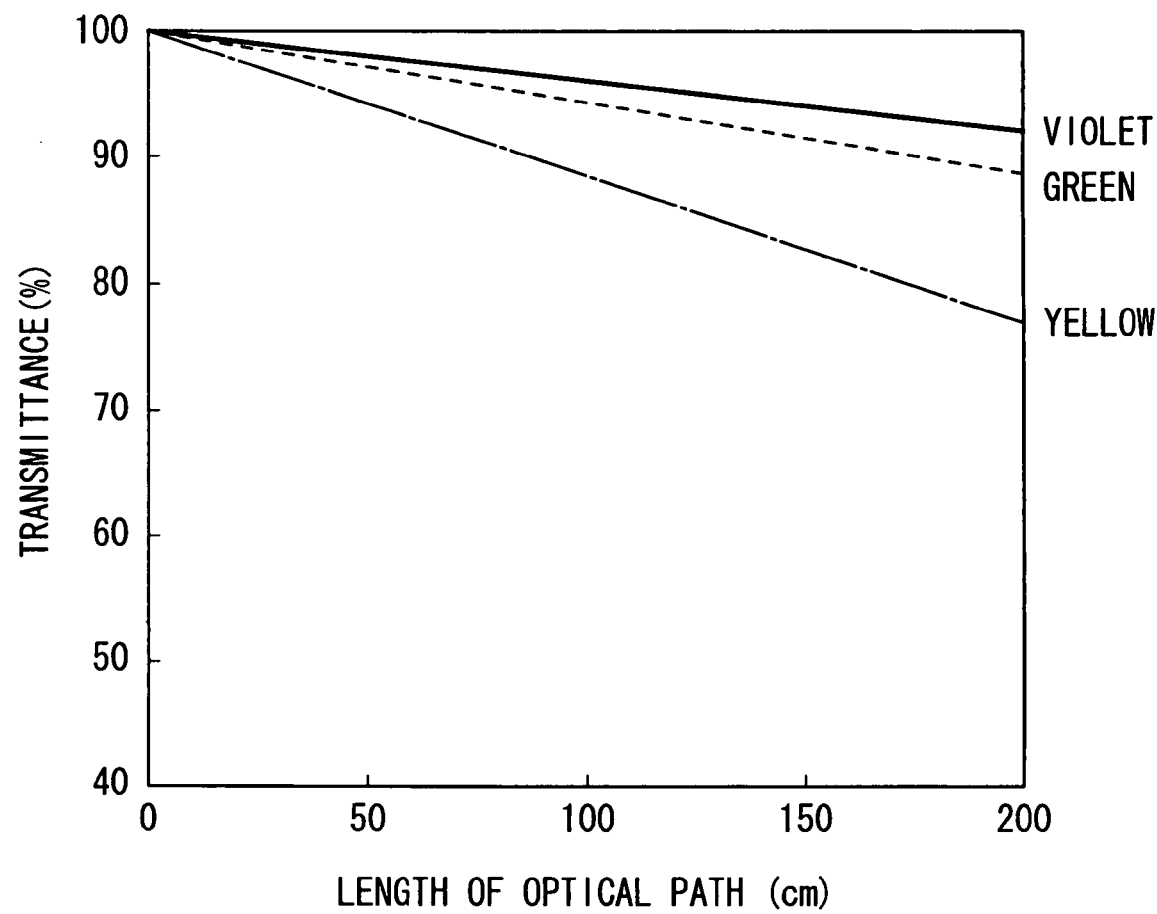
FIG. 12 is a graph showing transmittance of pure water for light of colors with respect to the optical path length in pure water.

On the other hand, in the immersion exposure apparatus, the perimeter of the photomask 105 is surrounded by the immersion liquid, such as pure water 241, and normally, the liquid, such as pure water, absorbs light. FIG. 12 shows examples of the transmittance of pure water for light of colors with respect to the optical path length in pure water. The longer the optical path, the greater the amount of light absorbed, and consequently, the smaller the amount of light reaching the destination. The transmittance also varies between the respective colors (namely, with the wavelengths of the lights). In the present embodiment, since ultraviolet light having the wavelength of 365 nm is used, then the transmittance is close to that for violet light in FIG. 12.

In this way, in the immersion exposure apparatus, the projected light is absorbed by the immersion liquid, such as pure water 241, which covers the periphery of the photomask 105. Here, if exposure is normally carried out by projecting light perpendicularly onto the photomask 105, then the absorption of projected light only produces a problem in terms of attenuating the intensity of light, or the like. On the other hand, when carrying out the tilt exposure, since the projected light perpendicularly falls on the liquid surface, then at the photomask 105, light intensity nonuniformity arises in the incident light reaching the photomask 105, and this means that the exposure of the photoresist applied on the photomask 105 becomes nonuniform. In other words, the distance traveled by the light from its point of incidence on the pure water until arriving at the surface of the photomask 105 (namely, the optical path length in the liquid) varies in accordance with the position on the photomask 105, and therefore the nonuniformity occurs in the intensity of light. More specifically, in a position on the photomask 105 to which the incident light of a short optical path is projected, the attenuation of the incident light is small, and therefore the intensity of the projected light reaching the surface of the photomask 105 is relatively large and the photoresist applied on the photomask 105 can be exposed satisfactorily; however, in a position on the photomask 105 to which the incident light of a long optical path is projected, the attenuation of the incident light is large, and therefore the intensity of the projected light reaching the surface of the photomask 105 is small in comparison with the case of the short optical path and it is not possible to satisfactorily expose the photoresist in the same exposure time period. If exposure is carried out for an exposure time period that enables satisfactory exposure in the region corresponding to the long optical path, then over-exposure occurs in the region corresponding to the short optical path, the photoresist is not exposed in the same state as the region of the long optical path, and hence the exposure of the photoresist is nonuniform.

Therefore, when carrying out the tilt exposure, the graded transmittance plate 242 is used, which has the transmittance distribution corresponding with the optical path lengths to the positions at the photomask 105. The graded transmittance plate 242 is configured to have the transmittance distribution in such a manner that when the projected light reaches the photomask 105 after having passed through the graded transmittance plate 242 and the pure water 241 serving as the immersion liquid, the intensity of the projected light is uniform over the whole surface of the photomask 105. More specifically, the graded transmittance plate 242 is configured in such a manner that the transmittance is high in a part through which the projected light passes and travels the long optical path to fall on the surface of the photomask 105, whereas the transmittance is low in a part through which the projected light passes and travels the short optical path to fall on the surface of the photomask 105.

When carrying out the tilt exposure, it is not impossible that the photomask 105 and the surface of the immersion liquid are mutually parallel, but an additional device, or the like, is required in order to maintain the liquid surface and the photomask 105 in a parallel state at all times, leading to increased costs, and furthermore, if the angle of incidence of the projected light with respect to the photomask 105 is intended to be large, then the total reflection of the incident light occurs on the liquid surface, and hence the projected light does not reach the photomask 105 and exposure is not carried out. More specifically, in the case of pure water having the refractive index of 1.44, the total reflection occurs when the angle of incidence of light is approximately 45° with respect to the liquid surface, and hence the projected light cannot be introduced at an angle of incidence larger than this. Consequently, in terms of the composition of the exposure apparatus, it is desirable that the projected light falls perpendicularly with respect to the liquid surface, and when forming a region of a large flare angle by means of the tilt exposure using the immersion exposure apparatus, it is necessary to use the graded transmittance plate 242.

There are liquids usable for immersion in the exposure apparatus other than pure water 241, and depending on circumstances, it is possible to use another liquid of this kind.

Figure 13:
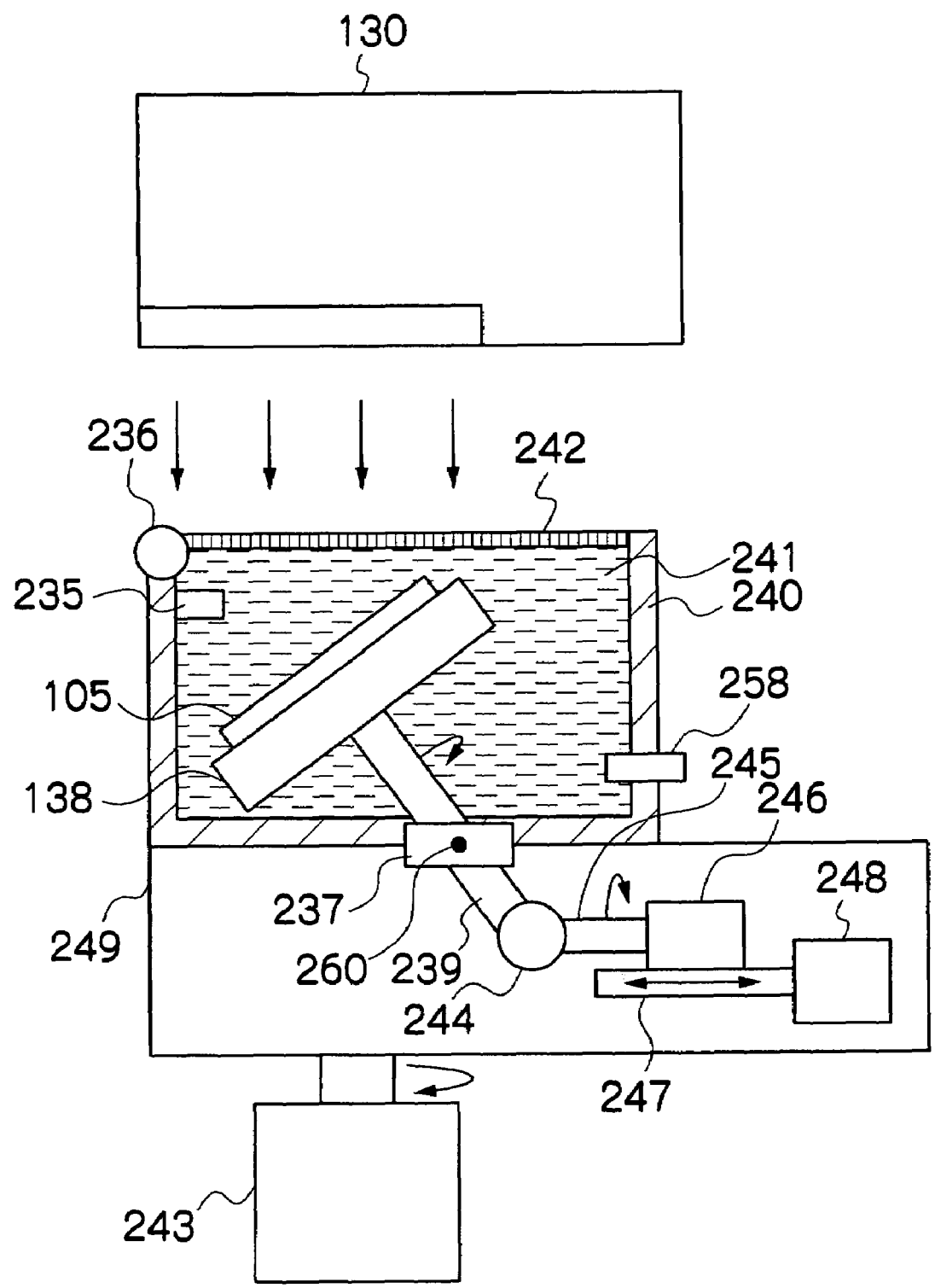
FIG. 13 is a schematic drawing of the mechanism of the exposure apparatus according to the second embodiment.

Next, the composition of the exposure apparatus according to the present embodiment is described more specifically with reference to FIG. 13. As shown in FIG. 13, in the exposure apparatus according to the present embodiment, the photomask 105 is disposed inside the immersion tank 240 in a closely fixed state with respect to the stage 138, and the pure water 241 serving as the immersion liquid can be supplied and discharged by means of a pump 258. A tilt rotation motor 246 is provided in order to rotate the rotating shaft 239 attached to the stage 138, and a rotating shaft 245 caused to rotate by the tilt rotation motor 246 transmits a rotation to the rotating shaft 239 via a free joint 244. The rotating shaft 239 is connected to the free joint 244 in a state where the rotating shaft 239 penetrates into the immersion tank 240, and the connecting portion which penetrates into the immersion tank 240 is connected via a spherical bearing 237 in such a manner that the pure water 241 in the immersion tank 240 does not leak out through this portion.

A light-receiving sensor 235 is provided inside the immersion tank 240, thereby making it possible to measure the intensity of the light projected and reflected on the photomask 105. It is then possible to confirm whether or not the installation position of the photomask 105 and the tilt angle of the stage 138 are a prescribed position and angle. If the photomask 105 is loose on the stage 130, then the direction of light reflected on the photomask 105 varies with the rotation of the stage 130, and therefore the intensity of light reflected on the photomask 105 as determined by the light-receiving sensor 235 changes with the rotation of the stage 130. Consequently, on the basis of the variation in the intensity of reflected light, it is possible to determine whether or not the photomask 105 is securely attached on the stage 138. Moreover, if the tilt angle of the stage 138 is not set to the prescribed tilt angle, then it is possible to adjust the tilt angle of the stage 138 on the basis of the intensity of reflected light obtained by the light-receiving sensor 235, in such a manner that the stage 138 has the prescribed tilt angle.

Furthermore, the stage 138 and the rotating shaft 239 are unitedly tiltable with respect to the projected light indicated. More specifically, the tilt rotation motor 246 is disposed on a tilt slider 247, and is able to move over the tilt slider 247 by means of a tilt motor 248. By moving the tilt rotation motor 246 on the tilt slider 247, it is possible to move both the rotating shaft 245 and the free joint 244. A fixed point 260 on the spherical bearing 237 arranged on the rotating shaft 239 remains fixed in the same position when the tilt rotation motor 246 is moved on the tilt slider 247, and therefore, by moving the tilt rotation motor 246 by means of the tilt motor 248, it is possible to change the tilt angle of the stage 138 and the photomask 105 with respect to the projected light indicated with the arrows. In the state where the stage 138 and the photomask 105 are disposed obliquely with respect to the projected light indicated with the arrows, the projected light obliquely falls onto the photomask 105, and it is possible to perform the tilt exposure by carrying out exposure in this state. Furthermore, by moving the tilt rotation motor 246 in the leftward direction in FIG. 13 by means of the tilt motor 248, the stage 138 is revolved about the fixed point 260 and thereby the angle of incidence of the projected light with respect to the photomask 105 can be changed. It is possible to carry out the perpendicular light exposure by performing exposure in a state where the stage 138 and the photomask 105 are perpendicular with respect to the projected light indicated with the arrows.

In the present embodiment, the graded transmittance plate 242 is arranged in such a manner that the graded transmittance plate 242 can be moved from above the immersion tank 240 by means of an opening and closing hinge 236. It is possible that the graded transmittance plate 242 is moved to a position outside the irradiation region of the projected light when carrying out the perpendicular exposure, whereas the graded transmittance plate 242 is moved to a position above the immersion tank 240, inside the irradiation region, when carrying out the tilt exposure.

A tilt device 249 is constituted of the tilt shaft 239, the free joint 244, the rotating shaft 245, the tilt rotation motor 246, the tilt slider 247 and the tilt motor 248. The optical axis rotation motor 243 can rotate the whole of the immersion tank 240 provided with the graded transmittance plate 242 and containing the photomask 105 and the stage 138 along with the tilt device 249, on the axis parallel to the optical axis of the projected light indicated with the arrows.

Figure 14:
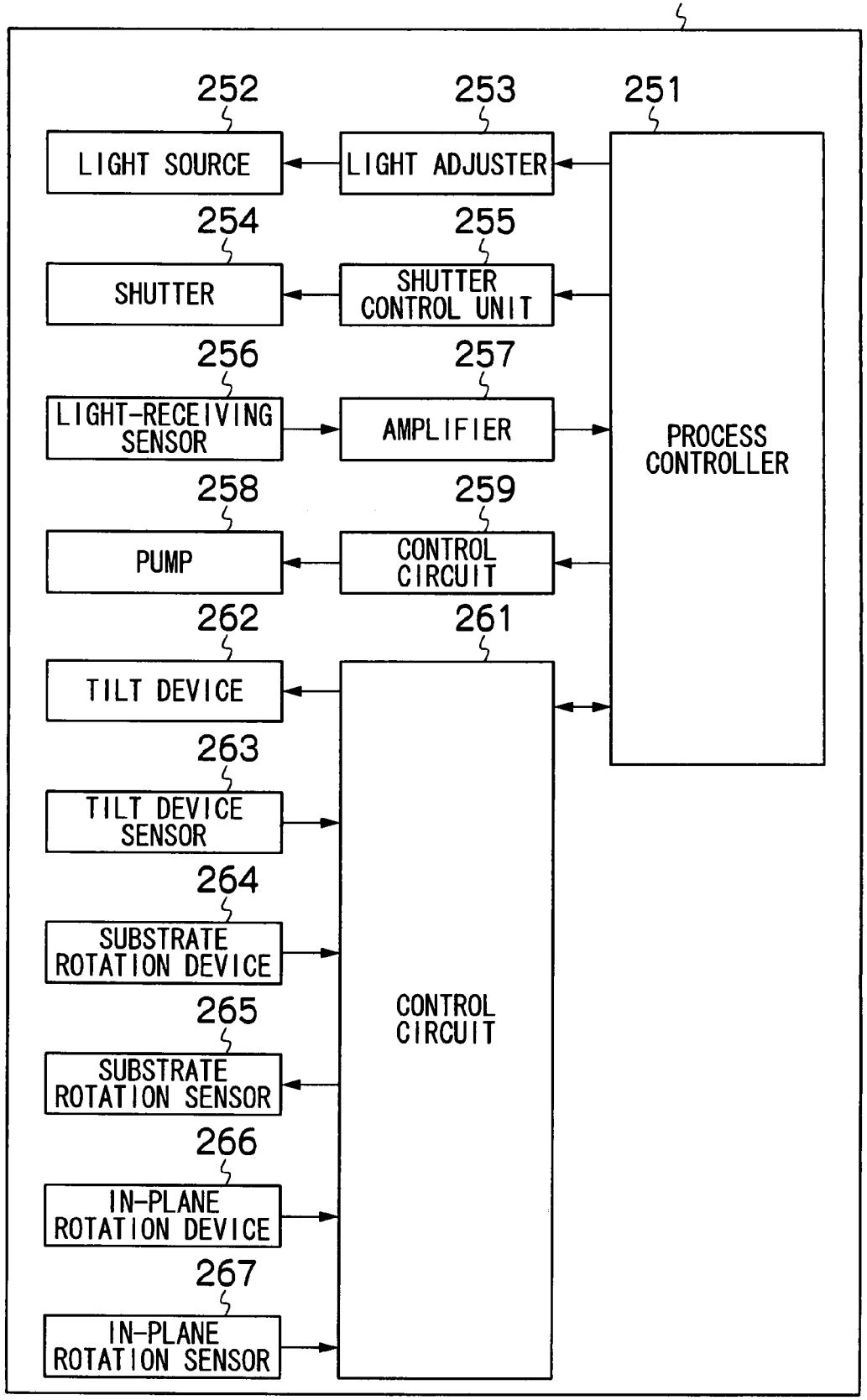
FIG. 14 is a block diagram showing the system configuration of the exposure apparatus according to the second embodiment.

Next, FIG. 14 shows a control system of the exposure apparatus according to the present embodiment.

The whole of the exposure apparatus 250 according to the present embodiment is controlled by a process controller 251. The process controller 251 is provided with a light adjuster 253 for controlling the amount of light emitted by the ultra-high pressure mercury lamp 131, which forms the light source 252. By controlling the light adjuster 253, it is possible to adjust the amount of light emitted by the light source 252. Moreover, in order to control the amount of light in the light source optical system 130, a shutter 254 (not shown in FIG. 3) is provided in the optical system, and the shutter 254 is controlled by a shutter control unit 155. The shutter control unit 255 controls the shutter 254 in accordance with instructions from the process controller 251.

A light-receiving sensor 256 is provided on the surface of the stage 138 onto which the projected light falls. In order to measure the intensity of the light passing through the photomask 105, or to measure the intensity of the light in the proximity of the photomask 105, the light-receiving sensor 256 is disposed on the surface of the stage 138 that makes contact with the photomask 105, or in the proximity of the photomask 105 on the stage 138, in such a manner that the light-receiving sensor 256 monitors the intensity of the incident light. The signal representing the intensity of the incident light issued by the light-receiving sensor 256 is amplified by an amplifier 257 and then transmitted to the process controller 251. In the process controller 251, in order to control the intensity of the light on the stage 138 on the basis of the signal issued by the light-receiving sensor 256 and amplified by the amplifier 257, a control signal is transmitted to the light adjuster 253 and the shutter control unit 255 in order to control the light source 252 and the shutter 254.

Moreover, in the exposure apparatus 250 according to the present embodiment, the stage 138 and the photomask 105 are disposed inside the immersion tank 240. The pump 258 is provided for supplying and discharging pure water 241 serving as the immersion liquid, to and from the immersion tank 240. The supply and discharge of pure water 241 by the pump 258 is controlled by a control circuit 259 in accordance with instructions from the process controller 251.

Further, the exposure apparatus 250 according to the present embodiment has the device for rotating the stage 138, on which the photomask 105 is disposed, and also changing the tilt angle of the stage 138 with respect to the projected light. More specifically, the rotation of the stage 138 is performed by means of a substrate rotation device 264, in accordance with instructions from the control circuit 261. The substrate rotation device 264 is constituted of the rotating shaft 239, the free joint 244, the rotating shaft 245, and the tilt rotation motor 246, and the substrate rotation device 264 serves as the device for rotating the stage 138. A substrate rotation sensor 265 is provided as a sensor required to control the substrate rotation device 264, and it is possible to determine the rotational state of the stage 138 and the start point and the end point of the rotation. The substrate rotation device 264 is controlled by the control circuit 261 on the basis of the positional information, and the like, obtained through the substrate rotation sensor 265.

Furthermore, as the device for changing the tilt angle with respect to the projected light, a tilt device 262 is provided, whereby the tilt angle with respect to the projected light can be changed in accordance with instructions from the control circuit 261. The tilt device 262 is constituted of the tilt slider 247 and the tilt motor 248, and the tilt device 262 makes the stage 138 tilt by moving the tilt rotation motor 246. A tilt device sensor 263 is provided as a sensor required to control the tilt device 262, and it is possible to determine the tilt angle of the stage 138 with respect to the projected light. The tilt device 262 is controlled by the control circuit 261 on the basis of the information obtained through the tilt device sensor 263.

Moreover, an in-plane rotation device 266 constituted of the optical axis rotation motor 243 is provided, and this forms an optical axis rotation device capable of rotating the whole of the immersion tank 240 and the tilt device unit 249, together with the stage 138 and the photomask 105, on the axis parallel to the optical axis of the projected light. An in-plane rotation sensor 267 is provided in order to determine the state of the in-plane rotation device 266, and the information obtained through the in-plane rotation sensor 267 is transmitted to the control circuit 261 and used by the control circuit 261 in order to control the in-plane rotation device 266. The tilt device 262, the substrate rotation device 264, and the in-plane rotation device 266 described above are controlled by means of the control circuit 261, on the basis of instructions from the process controller 251.

Figure 15:
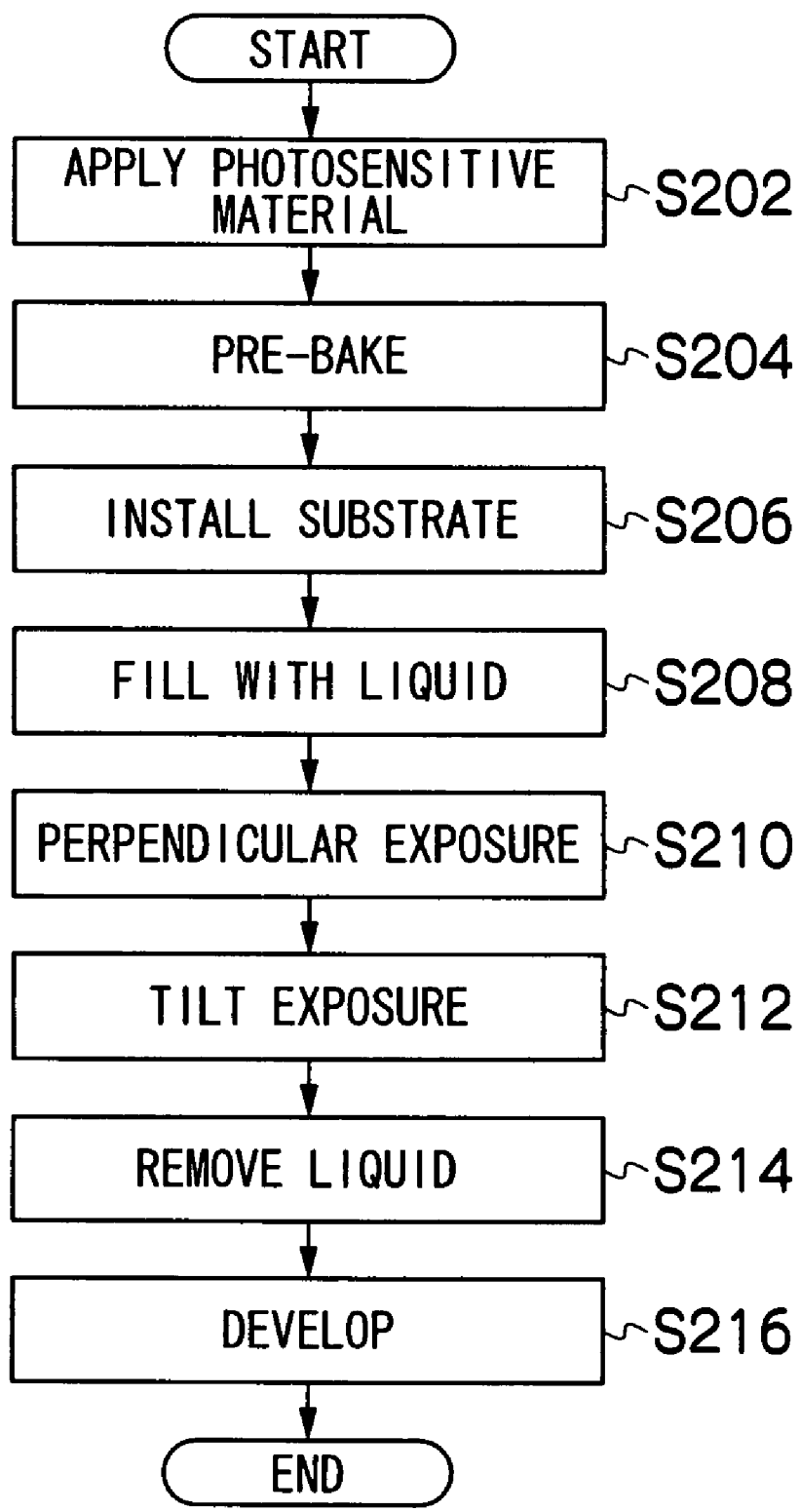
FIG. 15 is a flowchart of an embodiment of a manufacturing process using the exposure apparatus according to the second embodiment.

Next, a method of using the exposure apparatus according to the present embodiment is described with reference to FIG. 15. FIG. 15 shows the sequence of an embodiment of an exposure method using the exposure apparatus according to the present embodiment. The photomask used in the present embodiment is the same as that used in the first embodiment.

Initially, a negative resist is applied onto a photomask at step S202. More specifically, the negative resist is applied by spin coating, or the like, to the surface of the photomask 105 on which the optical interference layer and the optical shielding layer have been formed. The thickness of the applied film of the negative resist varies with the object that is to be manufactured, and in the present embodiment, a thick film resist is used. It is also possible to employ a method in which a dry film (DRF) is bonded to the photomask 105.

Subsequently, the photomask 105 coated with the negative resist is pre-baked at step S204.

Then, the photomask 105 forming a substrate is installed to the exposure apparatus at step S206. More specifically, the photomask 105 coated with the negative resist is installed on the stage 138 in such a manner that the surface of the photomask 105 coated with the negative resist is on the side reverse to the surface onto which the projected light falls. The stage 138 is disposed inside the immersion tank 240, and the photomask 105 is also disposed inside the immersion tank 240.

Thereupon, the immersion liquid is filled into the immersion tank 240 at step S208. More specifically, pure water 241 is supplied to the immersion tank 240 through the pump 258. The pure water is supplied until the immersion tank 240 becomes substantially full.

Then, at step S210, the perpendicular exposure is carried out, in which the projected light perpendicularly falls onto the photomask 105. In this case, the exposure is carried out in the state where the graded transmittance plate 242 has been moved away from the irradiation region of the projected light. The reason for this is that the graded transmittance plate 242 is used in order to obtain a uniform light intensity distribution on the surface of the photomask 105 when carrying out the tilt exposure as described below, and if the graded transmittance plate 242 is used when carrying out the perpendicular exposure, then conversely, the intensity of light becomes non-uniform. In the case of the perpendicular exposure, the exposure is carried out in a state where the stage 138 and the immersion tank 240 are stationary.

Thereupon, the tilt exposure is carried out at step S212, in which the projected light obliquely falls onto the photomask 105. More specifically, the stage 138 of the exposure apparatus according to the present embodiment is tilted with respect to the projected light by means of the tilt device, thereby enabling the projected light to obliquely fall onto the photomask 105. In the present embodiment, the tilt angle of the stage 138 is approximately 35° with respect to the projected light, and then the angle of incidence of the projected light with respect to the optical interference layer 102$b$ in the photomask 105 is also 35°. As seen from FIG. 2, if the angle of incidence is 35°, then due to the interference of the incident light in the optical interference layer 102b, the amount of incident light transmitted through the optical interference layer 102b becomes substantially zero.

In a case where the tilt exposure is carried out in this way, the exposure is performed after moving the graded transmittance plate 242 to the position above the immersion tank 240 by means of the opening and closing hinge 236. This is because the graded transmittance plate 242 is required in order to obtain a uniform distribution of the light intensity over the surface of the photomask 105 when carrying out the tilt exposure. While performing the tilt exposure, the stage 138 is rotated by the tilt rotation motor 246, and furthermore, the whole structure, together with the immersion tank 240 and the tilt device unit 249, is rotated on an axis parallel to the optical axis of the projected light, while maintaining the relative positions of the photomask 105 and the graded transmittance plate 242, by means of the optical axis rotation motor 243.

Thereupon, the immersion liquid is removed from the container at step S214. More specifically, the pure water 241 inside the immersion tank 240 is discharged by means of the pump 258, or the pure water 241 is discharged through a discharge port (not shown) formed in the immersion tank 240.

Subsequently, the negative resist 110 applied on the photomask 105 is developed at step S216.

Thus, the exposure process in the exposure apparatus according to the present embodiment is completed.

By means of this exposure process, it is possible to perform exposure with the light of large angle of incidence that has been difficult to achieve in the related art, and it is then possible to form exposed parts of large flare angle when forming exposed parts having different flare angles arranged in the direction perpendicular to the surface of the photoresist layer.

In the above-described exposure apparatus according to the present invention, it is possible to use a laser light source, such as a solid state laser, as the light source instead of the ultra-high pressure mercury lamp 131, and in this case, a beam expander is used in the optical system and the optical interference layer 102b in the photomask 105 is configured to comply with the wavelength of the laser light. Moreover, although the method of forming a nozzle plate for an inkjet head has been described as one example, and the exposure apparatus according to the present invention is not limited to this and it may also be used for various types of applications which require fine processing.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An exposure apparatus, comprising:
a light source which emits parallel light having a wavelength used for exposure;
a photomask which includes a substrate, an optical shielding layer and an optical selective layer, the substrate being capable of transmitting the light of the wavelength, the optical shielding layer being made of a material not transmitting the light of the wavelength, the optical selective layer selectively transmitting light in accordance with a shape to be formed by the exposure, the optical shielding layer and the optical selective layer being arranged on a first side of the substrate;
a photomask stage which holds the photomask of which the first side has been coated with photosensitive material, in such a manner that the light emitted from the light source falls on a second side of the photomask reverse to the first side and is projected to the photosensitive material on the first side;
a photomask rotation device which rotates the photomask stage on an axis perpendicular to the second side of the photomask; and
a photomask tilt device which is capable of tilting the photomask held on the photomask stage in such a manner that the light emitted from the light source falls perpendicularly and obliquely on the second side of the photomask.

2. The exposure apparatus as defined in claim 1, wherein the optical selective layer selectively transmits the light having a prescribed wavelength.

3. The exposure apparatus as defined in claim 1, wherein the optical selective layer selectively transmits the light having a prescribed angle of incidence.

4. The exposure apparatus as defined in claim 1, wherein the optical selective layer has transmittance for the light of the wavelength that transmittance changes in accordance with an angle of incidence of the light of the wavelength and is highest for the light of the wavelength incident perpendicularly on the second side of the photomask.

5. The exposure apparatus as defined in claim 4, wherein when the photomask is tilted by the photomask tilt device to make the light emitted from the light source fall obliquely on the second side of the photomask, a tilt angle of the photomask is adjusted in such a manner that the light falls on the second side of the photomask with the angle of incidence at which the light is not transmitted through the optical selective layer due to interference of the light incident in the optical selective layer.

6. The exposure apparatus as defined in claim 1, further comprising:
an immersion tank which holds liquid capable of transmitting the light of the wavelength emitted from the light source,
wherein the photosensitive material on the first side of the photomask is exposed to the light in a state where the photomask is immersed in the liquid in the immersion tank.

7. The exposure apparatus as defined in claim 6, further comprising a graded transmittance plate which is arranged on an interface of the liquid with air when the photosensitive material on the first side of the photomask is exposed to the light emitted from the light source in a state where the photomask is tilted to make the light fall obliquely on the second side of the photomask, the graded transmittance plate having graded transmittance for the light of the wavelength in such a manner that intensity of the light arriving at the second side of the photomask through the graded transmittance plate and the liquid is uniform over the second side of the photomask.

8. The exposure apparatus as defined in claim 7, wherein the photosensitive material on the first side of the photomask is exposed to the light in a state where the photomask, the photomask stage and the liquid are enclosed by the immersion tank and the graded transmittance plate.

9. The exposure apparatus as defined in claim 7, further comprising an optical axis rotation device which is capable of rotating the photomask and the photomask tilt device jointly on an axis parallel to an optical axis of the light falling on the photomask, while keeping positions of the photomask and the graded transmittance plate relative to each other.

10. The exposure apparatus as defined in claim 1, further comprising a light-receiving sensor which is arranged on the photomask stage and capable of measuring intensity of the light projected from the light source.

* * * * *